United States Patent [19]
Cho et al.

[11] Patent Number: 5,771,200
[45] Date of Patent: Jun. 23, 1998

[54] SEMICONDUCTOR MEMORY DEVICE

[75] Inventors: Il-Jae Cho, Suwon; Hyun-Soon Jang, Seoul, both of Rep. of Korea

[73] Assignee: Samsung Electronics Co., Ltd., Suwon, Rep. of Korea

[21] Appl. No.: 771,776

[22] Filed: Dec. 20, 1996

[30] Foreign Application Priority Data

Dec. 21, 1995 [KR] Rep. of Korea ............... 1995-53542

[51] Int. Cl.⁶ .................. G11C 8/00; G11C 7/00; G11C 5/02; G11C 5/06
[52] U.S. Cl. .................. 365/230.03; 365/189.05; 365/226; 365/51; 365/63
[58] Field of Search .............. 365/230.03, 189.05, 365/226, 51, 63; 257/691

[56] References Cited

U.S. PATENT DOCUMENTS

| | | | |
|---|---|---|---|
| 4,731,761 | 3/1988 | Kobayashi | 365/230.06 |
| 5,109,265 | 4/1992 | Utesch et al. | 365/51 |
| 5,150,330 | 9/1992 | Hag | 365/230.03 |
| 5,378,925 | 1/1995 | Sasaki | 257/691 |
| 5,416,347 | 5/1995 | Katto et al. | 257/296 |

Primary Examiner—David C. Nelms
Assistant Examiner—Trong Phan
Attorney, Agent, or Firm—Jones & Volentine, L.L.P.

[57] ABSTRACT

A semiconductor memory device reduces the distance occupied between a data path circuit and pads, and minimizes the length of data lines and main input/output lines, thereby improving an operating speed thereof. The semiconductor memory device includes a memory array divided into four array blocks which are independently arranged; a plurality of pads disposed in an area between the upper array blocks and the respective lower array blocks; a data path control circuit disposed in an area between the left array blocks and the respective right array blocks; a data path circuit disposed in a middle center area among the four array blocks; a plurality of data lines connecting the pads to the data path circuit; and a plurality of main input/output lines connecting the memory array to the data path circuit. In this configuration, a distance between the data lines and the main input/output lines and the data path circuit can be minimized.

3 Claims, 3 Drawing Sheets

SEMICONDUCTOR MEMORY DEVICE

BACKGROUND OF THE INVENTION

1. Field of the Invention

The present invention relates to semiconductor memory devices, and more particularly, to semiconductor memory devices which are capable of reducing the distance occupied between a data path circuit and pads and minimizing the length of data lines and main input/output lines, thereby improving an operating speed thereof. The present application is based on Korean Patent Application No. 53542/1995, filed Dec. 21, 1995, which is incorporated herein by reference.

2. Description of the Related Art

The development of an increased operating speed is generally an objective in the design of semiconductor memory devices. However, as the semiconductor memory devices become more and more integrated, an operating power supply voltage level is reduced, which makes it increasingly difficult to embody a high speed operation. Various research proposals have been put forth to obtain such a high speed operation in highly integrated memory devices. For example, efforts are continually made in the development of specific memory devices such as a synchronous memory device capable of achieving a high speed operation, and further efforts are directed to various modes which simultaneously access multi-bits during an access cycle, thereby indirectly obtaining the high speed operation. In this regard, as is realized by those skilled in the art, the degree to which the plural circuits disposed in the semiconductor memory device are optimally arranged so as to reduce the distance between the circuits or between devices plays a great role in the extent to which a high speed operation of the memory device is achieved.

FIG. 1 is a circuit diagram illustrating a circuit arrangement in a conventional semiconductor memory device. In the circuit, a memory cell array area 100 in the semiconductor memory device is generally divided into four array blocks. In the upper portion thereof, a first array block 10 and a third array block 30 are respectively positioned, and in the lower portion thereof, a second array block 20 and a fourth array block 40 are respectively positioned. A plurality of pads are disposed in an area (which is hereinafter referred to as "a middle area") of the cell array area 100 extending between the first and second array blocks 10, 20 and the third and fourth array blocks 30, 40. A data path circuit 50 (such as, for example, an input/output line sense amplifier, a multiplexer, a write driver and so on) and a data path control circuit 60 (which controls the data path circuit 50) are disposed in an area (which is hereinafter referred to as "a center area") of the cell array area 100 extending between the first and second array blocks 10, 20 and the third and fourth array blocks 30, 40. A power line and a bus line are disposed in an area 70 indicated by a dotted circle (which is hereinafter referred to as "a middle center area") of the cell area 100 facing the confronting edges of the first to fourth array blocks 10, 20, 30 and 40. Of course, although the data path circuit 50 and the data path control circuit 60 are shown in an upper center area between the first and third array blocks 10 and 30, they are also disposed in a lower center area between the second and fourth array blocks 20 and 40.

Each of the array blocks is comprised of a plurality of memory cells connected between a plurality of word lines and a plurality of bit line pairs. The bit lines are selectively coupled to an input/output line I/O. A final terminal of the input/output line I/O is connected to an input terminal of an input/output multiplexer I/O MUX whose output terminal is associated with the data path circuit 50 through a main input/output line MI/O. The output terminal of the data path control circuit 60 is connected to a control terminal of the data path circuit 50. The data path circuit 50 is coupled via a data line DL to input/output buffers which are in turn connected to input/output pads.

In the case of executing a read operation in the circuit arrangement shown in FIG. 1, data stored in the memory cells is transmitted to the input/output multiplexer I/O MUX through the input/output line I/O, and after completing a multiplexing operation, is loaded on the main input/output line MI/O. The data loaded on the main input/output line MI/O is transmitted to the data path circuit 50 and is delivered to the data input/output buffers via the data line DL. The data input/output buffers perform a predetermined buffering operation and produce output data which is transmitted via the data output pads to an exterior of the chip. The data read operation is completed in this manner. Meanwhile, in the case of a write operation, data inputted from an exterior of the chip is stored in a prescribed memory cell through data paths which are reverse that of the read operation.

As shown in FIG. 1, in the conventional semiconductor memory device, the data path circuit 50 is disposed in the center area of the cell array area 100. In this structure, the main input/output line MI/O accordingly is of considerable length and the data line DL similarly becomes lengthened. As a result, a relative long distance exists between the data path circuit 50 and the input/output pads, which increases the time period required to execute a data input/output operation, which in turn makes it difficult to achieve a semiconductor memory device capable of a desired high speed operation. In addition, the plural data path circuits and data path control circuits are located in the center area of the cell array area 100, which greatly complicates a layout of the center area, making further integration of the semiconductor memory device difficult to realize.

In short, a need exists for an improved semiconductor memory device which is capable of achieving higher speed operations.

SUMMARY OF THE INVENTION

It is an object of the present invention to provide a semiconductor memory device which can realize a high speed operation.

It is another object of the present invention to provide a semiconductor memory device which can obtain a high integration of the components thereof. To achieve these and other objects, a semiconductor memory device according to the present invention includes a memory array divided into four array blocks which are independently arranged; a plurality of pads disposed in a middle area between array blocks positioned in upper and lower portions in the four array blocks; a data path control circuit disposed in a center area between array blocks positioned in left and right portions in the four array blocks; a data path circuit disposed in a middle center area among the four array blocks; a plurality of data lines connecting the pads to the data path circuit; and a plurality of main input/output lines connecting the memory array to the data path circuit, so that a distance between the data lines and the main input/output lines and the data path circuit is minimized.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE PREFERRED EMBODIMENT

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
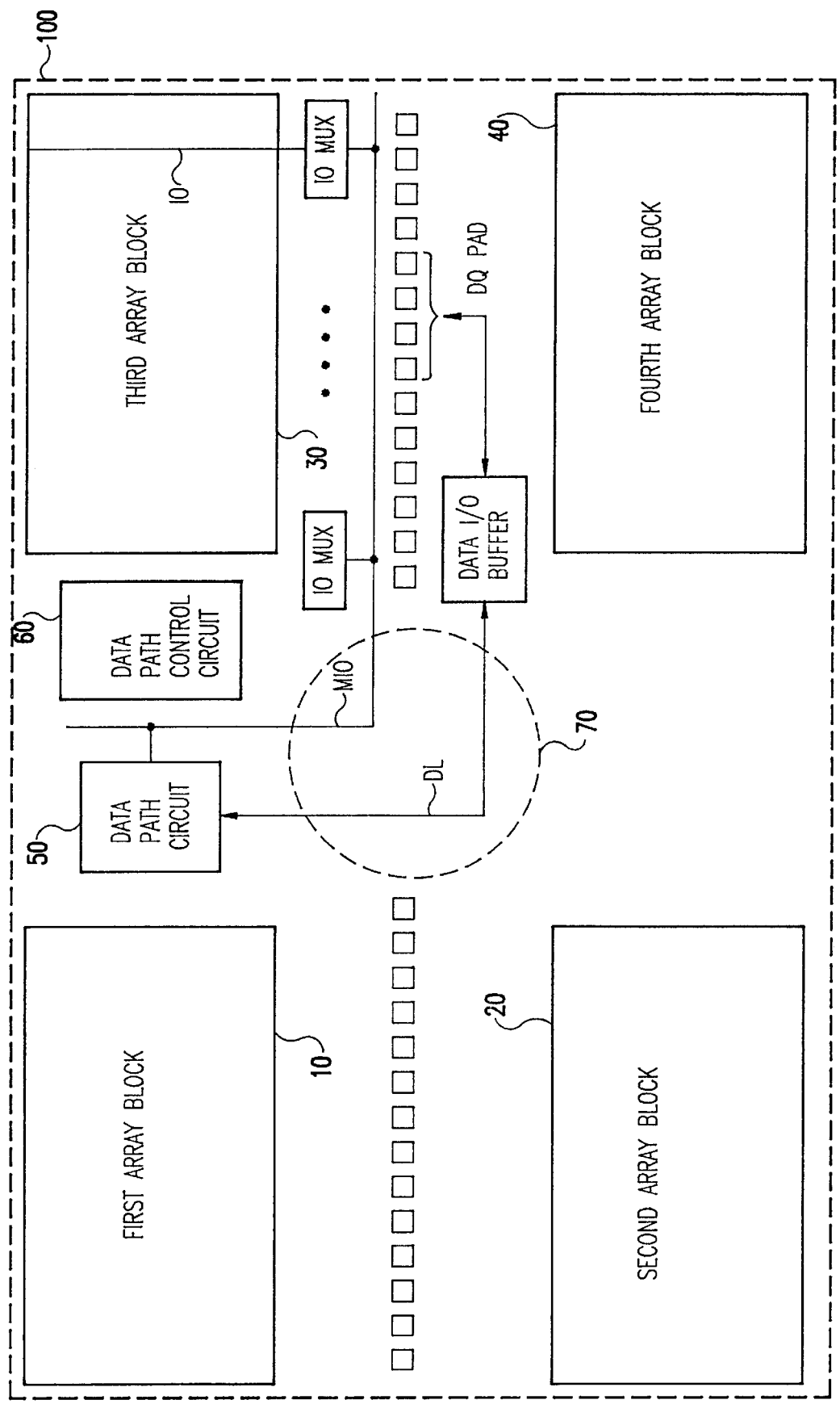
FIG. 1 is a circuit diagram illustrating a circuit arrangement in a conventional semiconductor memory device.
Figure 2:
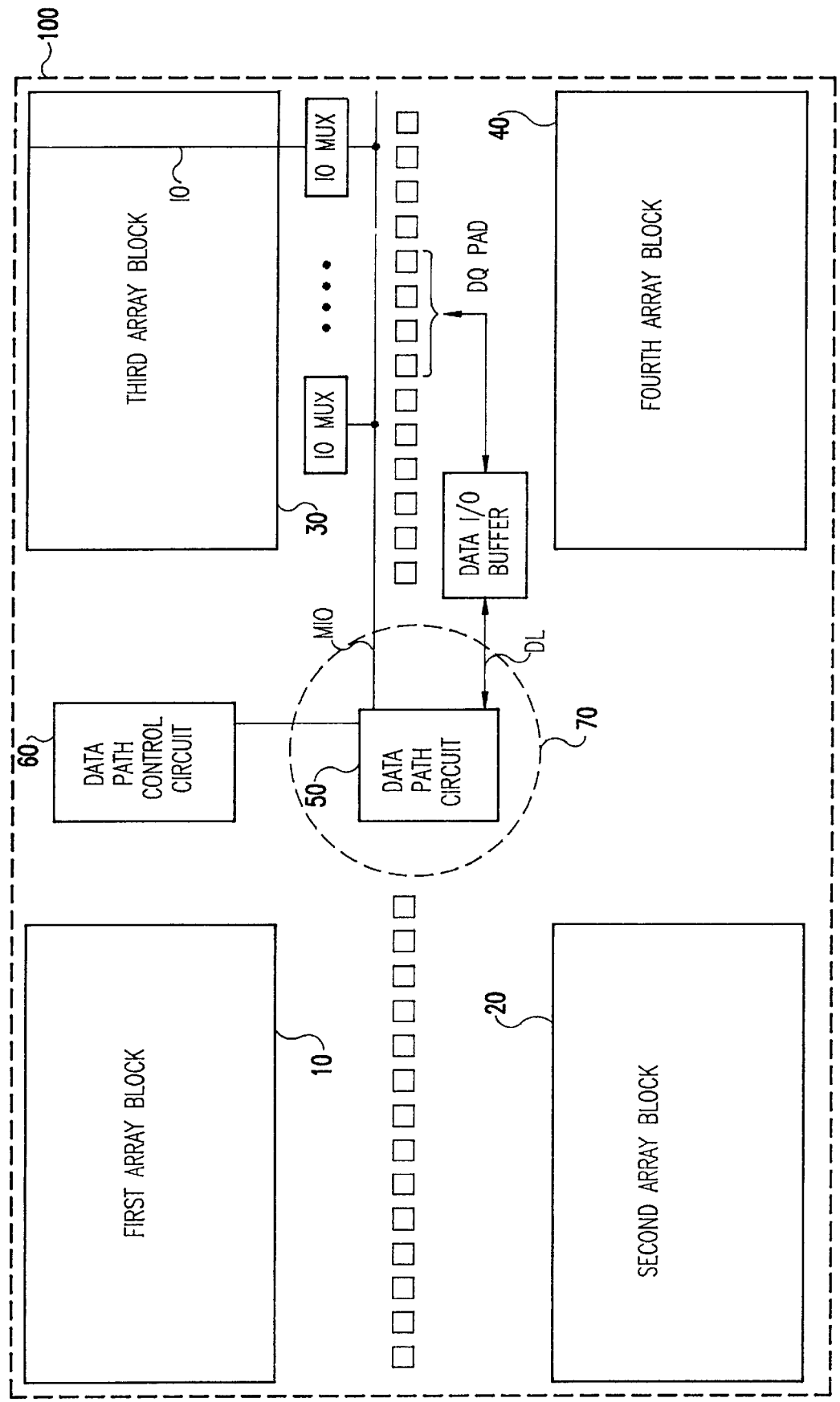
FIG. 2 is a circuit diagram illustrating a circuit arrangement in a semiconductor memory device according to the present invention.

Referring to FIG. 2, a circuit arrangement of a semiconductor memory device according to the present invention is shown. In this circuit arrangement, a memory cell array area 100 in the semiconductor memory device is divided into four array blocks. The four array block arrangement of FIG. 2 is the same as that shown in FIG. 1. That is, in the upper portion thereof, the first array block 10 and the third array block 30 are respectively positioned, and in the lower portion thereof, the second array block 20 and the fourth array block 40 are respectively positioned.

In the configuration of FIG. 2, a plurality of pads are disposed in the middle area extending between the first and second array blocks 10, 20 and the third and fourth array blocks 30, 40. The data path control circuit 60 is disposed in the center area defined as extending between the first and second array blocks 10, 20 and the third and fourth array blocks 30, 40. The data path circuit 50 is disposed in the middle center area 70 (denoted by a dotted circle) facing one corner edge of each of the first to fourth array blocks 10, 20, 30 and 40. In the configuration at the middle center area 70, the power line and the bus line are formed in a different layer than that of the data path circuit 50.

Each of memory cell array blocks is comprised of a plurality of memory cells connected between a plurality of word lines and a plurality of bit line pairs. The bit lines are selectively coupled to an input/output line I/O. One terminal of the input/output line I/O is connected to an input terminal of an input/output multiplexer I/O MUX whose output terminal is associated with the data path circuit 50 through the main input/output line MI/O. The output terminal of the data path control circuit 60 is connected to a control circuit of the data path circuit 50. The data path circuit 50 is coupled to input/output buffers which are connected to input/output pads.

Figure 3:
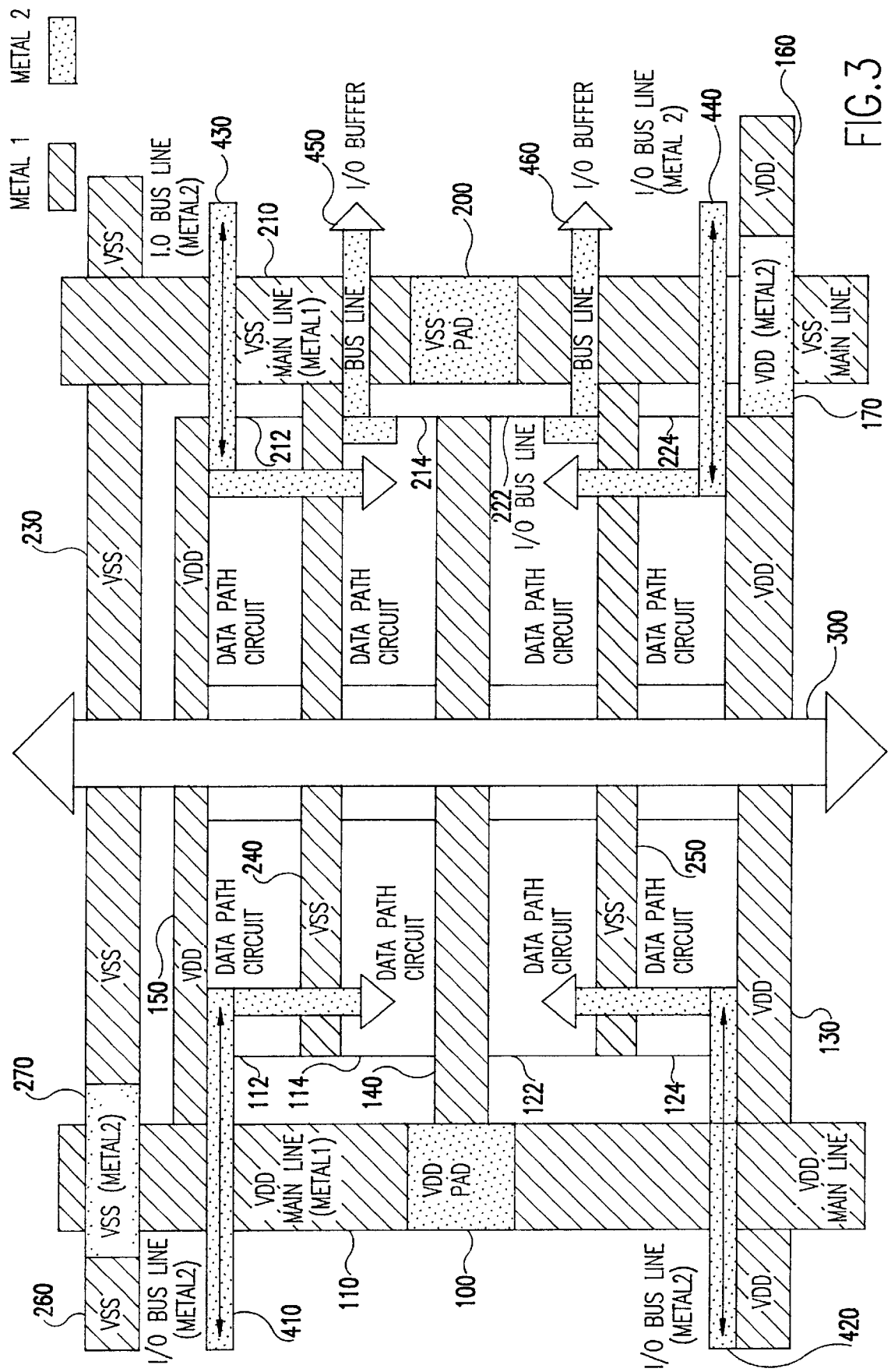
FIG. 3 is a detailed circuit diagram illustrating a middle center area of the arrangement shown in FIG. 2.

FIG. 3 is a detailed circuit diagram illustrating the middle center area 70 shown in FIG. 2. Referring to FIG. 3, in the configuration of the middle center area 70, eight data path circuits are arranged in the lowermost portion thereof. The data path circuits 112 and 114 are connected to the first array block 10, and the data path circuits 122 and 124 to the second array block 20. The data path circuits 212 and 214 are connected to the third array block 30, and the data path circuits 222 and 224 to the fourth array block 40. Next, the arrangement of power lines and bus lines is completed by implementing first and second metal formation processes. In this case, the hatched area in FIG. 3 is formed by the first metal formation process and the dotted area by the second metal process formation.

First, in the first metal formation process, a positive power (VDD) main line 110 is formed in the left portion and a reference power (VSS) main line 210 is formed in the right portion. VSS lines 230, 240 and 250 connected to the VSS main line 210 and VDD lines 130, 140 and 150 connected to the VDD main line 110 are formed in turn from the upper portion to the lower portion. A VSS line 260 is formed over the VDD main line 110 of the uppermost VSS line 230, and a VDD line 160 is formed over the VSS main line 210 of the lowermost VDD line 130. Thus, the first metal formation process is completed.

Then, in the second metal formation process, a VDD pad 100 is formed on the center area of the VDD main line 110, and a VSS pad 200 is formed on the center area of the VSS main line 210. Further, a VSS line 270 is formed to connect the VSS line 230 to the VSS line 260, and a VDD line 170 is formed to connect the VDD line 130 to the VDD line 160. A bus line 300 is formed in a vertical direction. Bus lines 410 to 440 are formed to connect each of the data path circuits to input/output bus lines and bus lines 450 and 460 are formed to connect the data path circuits to the input/output buffers. Thus, the second metal formation process is completed.

As previously described, a semiconductor memory device according to the present invention can minimize a distance between data path circuits and data input/output pads and thereby reduce distances between the data path circuits and main input/output lines and between data lines and the data path circuits. Therefore, data input/output paths are relatively simple under the circuit arrangement according to the present invention and a high speed operation can be embodied. Moreover, the data path circuits are not disposed along the length of center area between arrays, but instead are disposed in the middle center area, so that the design layout as well as integration of the semiconductor memory device may be easily accomplished.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A semiconductor memory device, comprising:
   a memory array having four spaced apart and discrete array blocks, including a first array block located in an upper left quadrant of said memory array, a second array block located in a lower left quadrant of said memory array, a third array block located in an upper right quadrant of said memory array, and a fourth array block located in a lower right quadrant of said memory array;
   a plurality of pads disposed in at least one of a first middle area extending between said first and third array blocks and a second middle area extending between said second and fourth array blocks;
   a data pad control circuit disposed in at least one of a first center area extending between said first and third array blocks and a second center area extending between said second and fourth array blocks;

a data path circuit disposed in a middle center area of said memory array, said middle center area extending between the first and second middle areas and between the first and second center areas;

a plurality of data lines connecting said pads to said data path circuitry; and a plurality of main input/output lines connecting said memory array to said data path circuit.

2. The semiconductor memory device as claimed in claim 1, further comprising power lines and bus lines which are located in said middle center area.

3. The semiconductor memory device as claimed in claim 2, wherein said power lines and said bus lines are disposed in a different layer than that of said data path circuit.

* * * * *